(12) United States Patent
Lin et al.

(10) Patent No.: US 9,711,683 B2
(45) Date of Patent: Jul. 18, 2017

(54) SEMICONDUCTOR DEVICE AND THE METHOD OF MANUFACTURING THE SAME

(71) Applicants: Epistar Corporation, Hsinchu (TW); HUGA OPTOTECH INC., Taichung (TW)

(72) Inventors: Heng-Kuang Lin, Taichung (TW); Ya-Yu Yang, Taichung (TW)

(73) Assignee: EPISTAR CORPORATION, Hsinchu (TW)

( * ) Notice: Subject to any disclaimer, the term of this patent is extended or adjusted under 35 U.S.C. 154(b) by 36 days.

(21) Appl. No.: 14/498,104

(22) Filed: Sep. 26, 2014

(65) Prior Publication Data

US 2016/0093699 A1 Mar. 31, 2016

(51) Int. Cl.
| | |
|---|---|
| *H01L 33/12* | (2010.01) |
| *H01L 21/02* | (2006.01) |
| *H01L 29/20* | (2006.01) |
| *H01L 33/32* | (2010.01) |
| *H01L 21/265* | (2006.01) |
| *H01L 29/812* | (2006.01) |

(52) U.S. Cl.
CPC .......... *H01L 33/12* (2013.01); *H01L 21/0254* (2013.01); *H01L 21/02381* (2013.01); *H01L 21/02458* (2013.01); *H01L 21/02505* (2013.01); *H01L 21/26506* (2013.01); *H01L 29/2003* (2013.01); *H01L 29/812* (2013.01); *H01L 33/32* (2013.01)

(58) Field of Classification Search
CPC ........................... H01L 21/02381; H01L 33/12

USPC ............................................................. 257/94
See application file for complete search history.

(56) References Cited

U.S. PATENT DOCUMENTS

| | | | | |
|---|---|---|---|---|
| 5,032,893 | A * | 7/1991 | Fitzgerald, Jr. ... | H01L 21/02395 257/190 |
| 5,269,852 | A * | 12/1993 | Nishida ............. | H01L 31/03682 136/258 |
| 5,269,876 | A * | 12/1993 | Mizutani ................. | C30B 25/18 117/106 |
| 5,281,283 | A * | 1/1994 | Tokunaga ............... | C30B 25/02 117/923 |
| 6,010,937 | A * | 1/2000 | Karam .............. | H01L 21/02381 257/E21.125 |
| 9,105,469 | B2 * | 8/2015 | Patel ................. | H01L 21/02381 257/190 |
| 9,263,530 | B2 * | 2/2016 | Cheng ..................... | H01L 29/36 |
| 9,306,118 | B2 * | 4/2016 | Tsai ........................ | H01L 33/22 |
| 9,536,747 | B2 * | 1/2017 | Yvon ................. | H01L 29/66212 |
| 2005/0176217 | A1 * | 8/2005 | Tseng ...................... | C30B 23/04 438/478 |

(Continued)

*Primary Examiner* — Jarrett Stark
*Assistant Examiner* — Charles N Ausar-El
(74) *Attorney, Agent, or Firm* — Ditthavong & Steiner, P.C.

(57) ABSTRACT

The present application discloses a semiconductor device comprising a crystalline substrate having a first region and a second region, a nuclei structure on the first region, a first crystalline buffer layer on the nuclei structure, a void between the second region and the first crystalline buffer layer, a second crystalline buffer layer on the first crystalline buffer layer, an intermediate layer located between the first crystalline buffer layer and the second crystalline buffer layer, and a semiconductor device layer on the second crystalline buffer layer.

20 Claims, 7 Drawing Sheets

(56) References Cited

U.S. PATENT DOCUMENTS

| | | | | |
|---|---|---|---|---|
| 2006/0292719 | A1* | 12/2006 | Lochtefeld | H01L 21/02381 438/22 |
| 2007/0085093 | A1* | 4/2007 | Ohmae | C30B 23/04 257/89 |
| 2007/0275492 | A1* | 11/2007 | Huffaker | H01L 21/187 438/46 |
| 2008/0001169 | A1* | 1/2008 | Lochtefeld | H01L 21/2018 257/190 |
| 2008/0121903 | A1* | 5/2008 | Hiramatsu | H01L 21/0237 257/89 |
| 2008/0315222 | A1* | 12/2008 | Kim | H01L 21/02458 257/94 |
| 2010/0117057 | A1* | 5/2010 | Noh | H01L 21/0242 257/13 |
| 2010/0216277 | A1* | 8/2010 | Fiorenza | H01L 21/02381 438/94 |
| 2011/0049568 | A1* | 3/2011 | Lochtefeld | H01L 21/02381 257/190 |
| 2012/0187370 | A1* | 7/2012 | Jeong | H01L 33/486 257/13 |
| 2012/0235163 | A1* | 9/2012 | Watanabe | H01L 21/02381 257/77 |
| 2013/0020580 | A1* | 1/2013 | Evans | C30B 23/025 257/76 |
| 2013/0200495 | A1* | 8/2013 | Keller | H01L 21/0237 257/615 |
| 2015/0187876 | A1* | 7/2015 | Hu | H01L 29/0688 257/76 |
| 2015/0270120 | A1* | 9/2015 | Wang | H01L 21/0262 438/503 |
| 2016/0093771 | A1* | 3/2016 | Shatalov | H01L 21/0237 257/94 |
| 2016/0247967 | A1* | 8/2016 | Ward | H01L 33/12 |

* cited by examiner

SEMICONDUCTOR DEVICE AND THE METHOD OF MANUFACTURING THE SAME

BACKGROUND

Technical Field

The present disclosure relates to a semiconductor device and the manufacturing method of the same, and in particular to a semiconductor device comprising a crystalline substrate.

Description of the Related Art

Because of the demand for switch control apparatus in high frequency operation, III-V materials, such as GaN, have been widely used in research and development recently. With the piezoelectric effect between layers comprising III-V material, two-dimensional electron gas (2DEG) is provided. Thus, the high mobility of electrons, high concentration of electrons in 2DEG and the low sheet resistance of layers are provided by a switch control apparatus comprising layers having III-V materials and having the benefits of high current density output signal, low switching loss and high voltage operation.

The III-V materials are not only widely used in switch control apparatus, but also applied to other semiconductor devices, such as light-emitting device, for the benefits of high current density. The layers comprising III-V materials are epitaxially formed on a substrate. However, the lattice constants difference and the coefficients of thermal expansion difference between III-V materials and the substrate induce dislocations, cracks or amorphization of III-V material in the layers.

SUMMARY OF THE DISCLOSURE

A semiconductor device, comprising a crystalline substrate having a first region and a second region; a nuclei structure on the first region of the substrate; a first crystalline buffer layer on the nuclei structure, lattice-mismatched with the substrate; a void between the second region of the substrate and the first crystalline buffer layer; a second crystalline buffer layer on the first crystalline buffer layer; an intermediate layer located between the first crystalline buffer layer and the second crystalline buffer layer, and a semiconductor device layer on the second crystalline buffer layer.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere in the disclosure. The thickness or the shape of an element in the specification can be expanded or narrowed. It is noted that the elements not drawn or described in the figure can be included in the present application by the skilled person in the art.

Figure 1A:
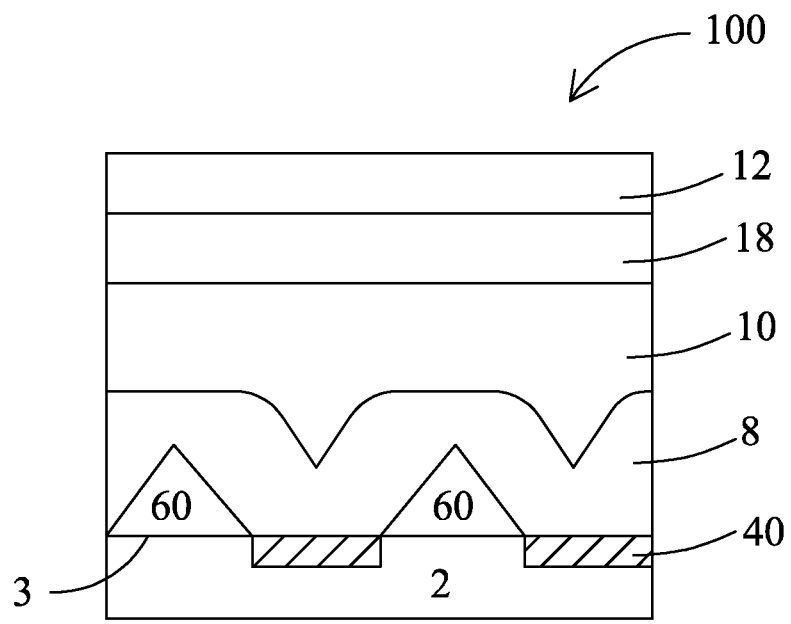
FIG. 1A shows a semiconductor device in accordance with an embodiment of the present disclosure.

FIG. 1A shows a cross-sectional view of a semiconductor device 100 in accordance with an embodiment of this application. The semiconductor device 100 comprises a substrate 2 having surface 3 divided into a first region and a second region, multiple pattern structures 40, a nuclei structure 60, a first buffer layer 8, an intermediate layer 10, a second buffer layer 18 and a semiconductor device layer 12. The semiconductor device layer 12 located on the second buffer layer 18 comprises an active layer. The active layer is configured to emit a light when the semiconductor device 100 is a light-emitting device; the active layer is configured to be a channel for current transmittance when the semiconductor device 100 is a power device. The intermediate layer 10 on the first buffer layer 8 does not contact the multiple pattern structures 40. The intermediate layer 10 comprises an element having a variant concentration. The variant concentration changes according to the distance between the surface 3 and the position within the intermediate layer 10. The second buffer layer 18 locates on the intermediate layer 10. The first buffer layer 8 and the second buffer layer 18 are crystalline buffer layers. The two buffer layers 8 and 18 comprise an identical element.

Figure 1B:
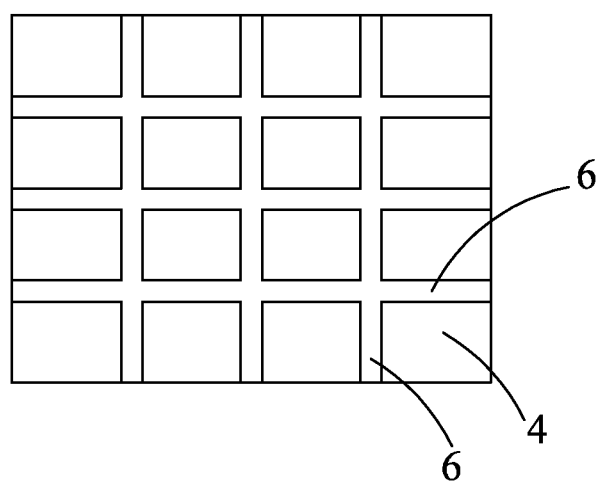
FIG. 1B shows a top view of a substrate and a nuclei structure in a semiconductor device in accordance with an embodiment of the present disclosure.

Referring to FIG. 1B, the first regions 4 are arranged as a first pattern and the second region 6 has a second pattern complementary to the first patterns. The second region 6 is continuous and the first regions 4 are separated by the second region 6. The areas of the first regions 4 can be the same or at least one of the first regions 4 has different area from other first regions 4. In this embodiment, the shape of one first region 4 is rectangular or square. In another embodiment, the shape of the first region 4 can be a circle or a triangular. The nuclei structure 60 are formed on the second region 6 and are continuous while the multiple pattern structures 40 are formed on the first regions 4 and are separated. The pattern structure 40 formed on the second region comprise a part in the substrate 2 and a part on the substrate 2. The multiple pattern structures 40 are surrounded by and adjacent to the nuclei structure 60. In this embodiment, the nuclei structure 60 has multiple regions in cross sectional view with a shape of a triangle having an inclined sidewall near the adjacent pattern structure 40. In another embodiment, the nuclei structure 60 has a curved sidewall. The first buffer layer 8 is formed on the nuclei structure 60 and covers a portion of the pattern structures 40 adjacent to the nuclei structure 60. The first buffer layer 8 further comprises a flat top surface substantially above the first region 4 and covers the nuclei structure 60. The first buffer layer 8 is configured to be continuous and covers the first region 4 and the second region 6.

Figure 2A:
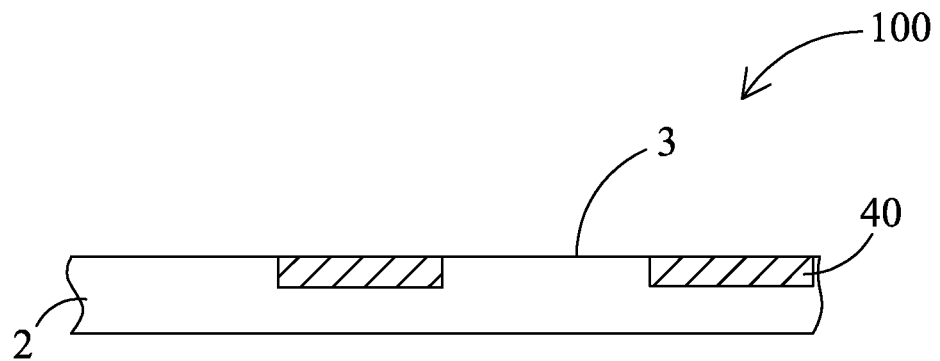
FIGS. 2A-2F show a manufacturing process of a semiconductor device 100 in accordance with an embodiment of this application.

FIGS. 2A-2E show a manufacturing process of a semiconductor device 100 in accordance with an embodiment of this application. In the present embodiment, the substrate 2 is a single crystalline structure and comprises a surface 3 divided into first regions 4 and a second region 6. The multiple pattern structures 40 are formed on the first regions 4 of the surface 3. The multiple pattern structure 40 can be formed by a surface treatment, such as ion implantation. The ions, which can be nitrogen, oxygen, carbon, argon, boron or phosphorus, are implanted into the first regions of the substrate 2 and change the lattice constant of the region in the substrate 2. In other words, the first regions 4 comprise an impurity absent in the second region 6. The ion injected into the substrate 2 damages the lattice structure so the connection between the atoms in the structure is broken. Therefore, the crystalline structure in the first region 4 of the substrate 2 is damaged by the surface treatment of ion injection. Consequently, the pattern structures 40 are formed as polycrystalline structures or amorphous structures. As FIG. 2A shows, the pattern structures 40 are embedded in the substrate 2, and the lattice constant of a pattern structure 40 is different from that of the remaining part of the substrate 2. In the present embodiment, the material of the substrate 2 is silicon, the pattern structure 40 is formed by ion implantation with carbon, and the nuclei structure 60 comprises aluminum nitride (AlN).

Figure 2B:
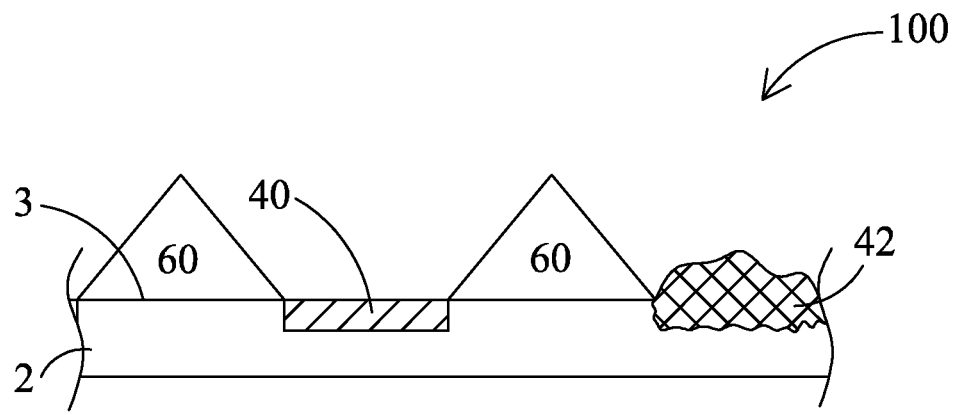
Figure 2B:
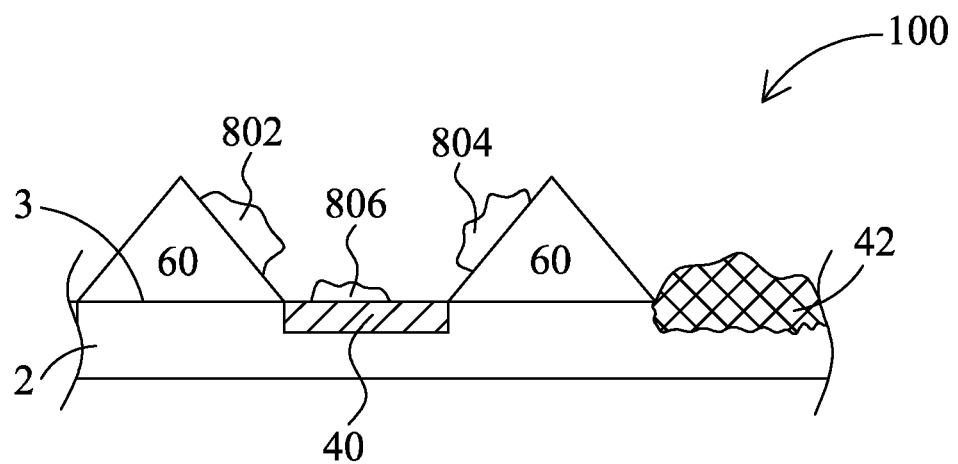

As shown in FIG. 2B, the nuclei structure 60 is formed between two pattern structures 40 on the surface 3. As mentioned above, the lattice constants and the lattice directions of the substrate 2 and the pattern structures 40 are different. Because of the lattice constant mismatch between the nuclei structure 60 and the pattern structures 40, the nuclei structure 60 is more likely to be epitaxially grown on the second region 6 of the surface 3. In other words, the surface of the pattern structures 40 is not suitable for epitaxial growth process, and the pattern structures 40 act as a mask while forming the nuclei structure 60. The nuclei structure 60 comprises multiple regions in cross-sectional view wherein each region has inclined side walls directly connected to the pattern structures 40 in a triangular shape. Each region of nuclei structure 60 has a top and a bottom which is wider than the top. Besides, the bottom of a nuclei structure 60 can be a flat surface, and the top of a nuclei structure 60 can be a vertex or a flat surface with an area smaller than that of the bottom, and the inclined side wall has a substantially flat surface or can be a rough surface. In another embodiment, the cross-sectional view of a nuclei structure 60 is a conical shape having a flat top surface. In another embodiment, part of the pattern structures 40 protrudes from the substrate 2 and is above the surface 3. Furthermore, the part of the pattern structures 40 above the surface 3 has a height smaller than that of the nuclei structure 60.

Figure 2C:
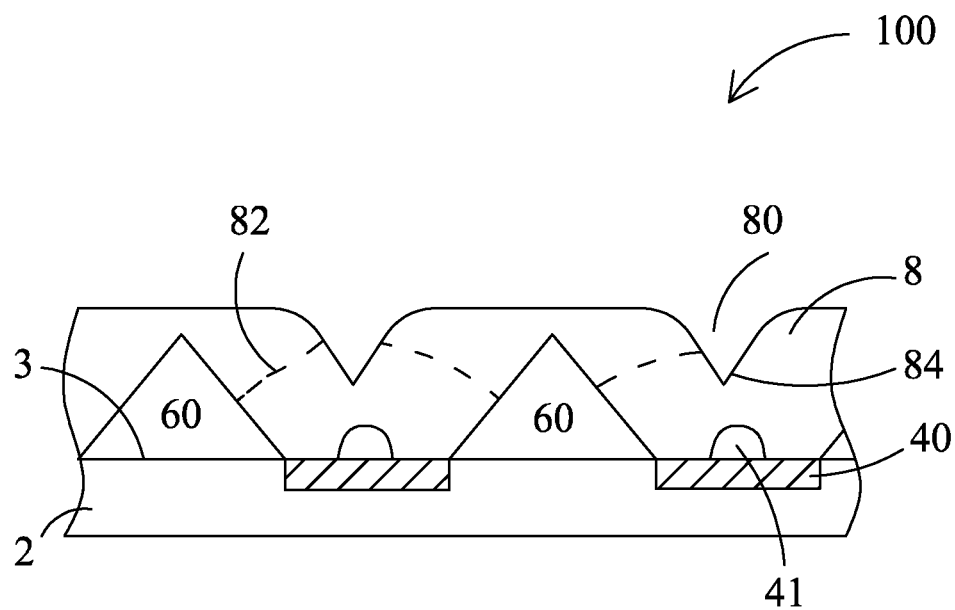

Referring to FIG. 2C, the first buffer layer 8 is formed on the nuclei structure 60 and the pattern structures 40. In another embodiment, the surface 3 is not fully covered by the pattern structures 40 and the nuclei structure 60, thus the first buffer layer 8 contacts the uncovered portion of the surface 3. Because the growth rate of the first buffer layer 8 on the inclined surface of the nuclei structure 60 is different from that on the pattern structures 40 during growing the first buffer layer 8, the first buffer layer 8 is prone to deposit on the inclined surface of the structure 60. Thus, the thickness of the first buffer layer 8 increases more quickly on the inclined surfaces than on the pattern structures 40.

The beginning of forming the first buffer layer 8 is shown in FIG. 2B'. According to FIG. 2B', two portions 802 and 804 are separately located on the two facing inclined surfaces of two adjacent regions of the nuclei structure 60, and one portion 806 is located on one of the pattern structures 40 between the two facing inclined surfaces. Since the growth rate at the side walls is different from that at the surface 3, the two portions 802 and 804 grow more quickly than the portion 806 on the pattern structure 40. Then, the two portions 802 and 804 merge with each other above the pattern structures 40 without merging with the portion 806 so a void 41 is therefore formed as FIG. 2C indicated. In other words, the portions 802 and 804 are merged to form the buffer layer 8, and the recesses 80 are formed on the surface of the buffer layer 8 above the pattern structures 40 because of the different growth rates at the sidewall and at the surface 3. In an embodiment, at least one of the recesses 80 is aligned with one void 40. In another embodiment, the recesses 80 are randomly positioned.

Figure 2D:
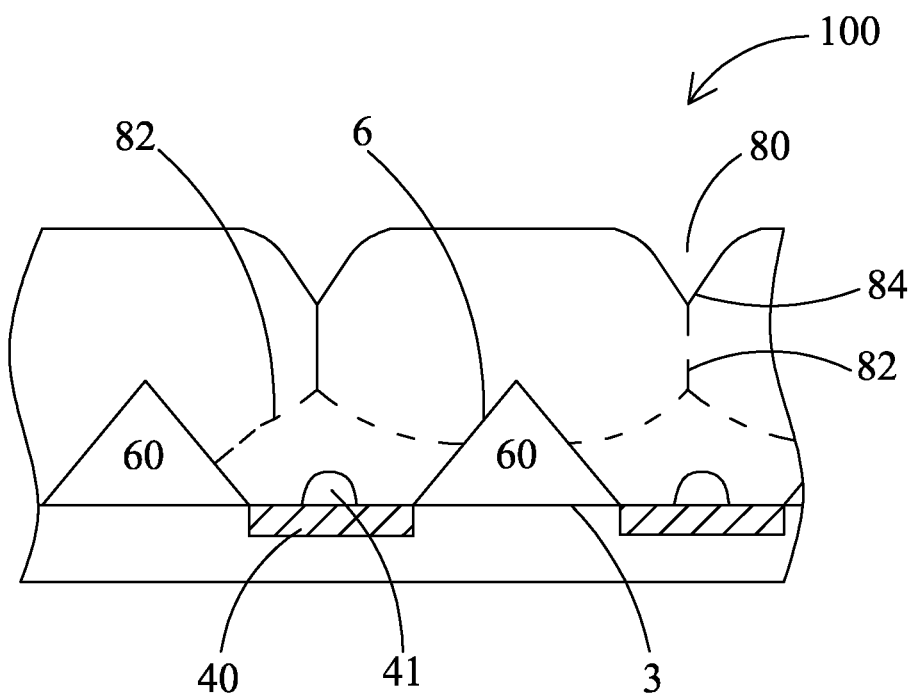

Each recess 80 comprises a vertex portion 84 above the pattern structure 4 and the surface of the recess 80 can be a flat surface or a rough surface. In another embodiment, the vertex portion 84 extends to contact with the void 41. Referring to FIG. 2D, since the first buffer layer 8 is grown on the inclined surfaces of the nuclei structure 60, some thread dislocations 82 are formed following the growth direction of first buffer layer 8, which can be the fastest direction of epitaxial growth. The thread dislocations 82 can be continuous or discontinuous and are formed upward from the inclined surface along a direction from one inclined surface to the other inclined surface. To be more specific, the thread dislocation 82 is grown in a direction upward from the above of the first region and bending in a direction toward the second region to connect the other dislocation 82 above the first region 4. The surface of the first buffer layer 8 opposing to the surface 3 can be a flat surface or a rough surface. Moreover, the surface of the first buffer layer 8 can be parallel to or be inclined with the surface 3.

Figure 2E:
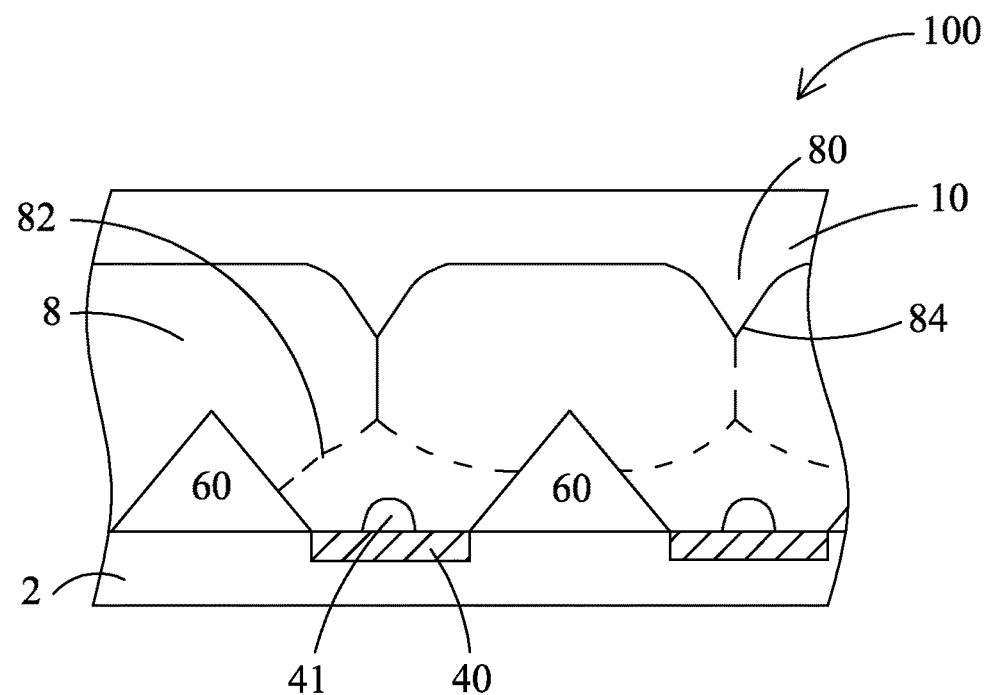

Referring to FIG. 2E, the recesses 80 are filled by the intermediate layer 10. In another embodiment, the recess 80 extends in a direction toward the surface 3 and reaches the voids 41 so the intermediate layer 10 contacts the voids 41. The surface roughness of the first buffer layer 8 is larger than that of the intermediate layer 10 and smaller than that of the nuclei structure 60. In another embodiment, the surface between the first buffer layer 8 and the intermediate layer 10 is a flat surface, and the surface can be parallel to or inclined with the surface 3.

Figure 2F:
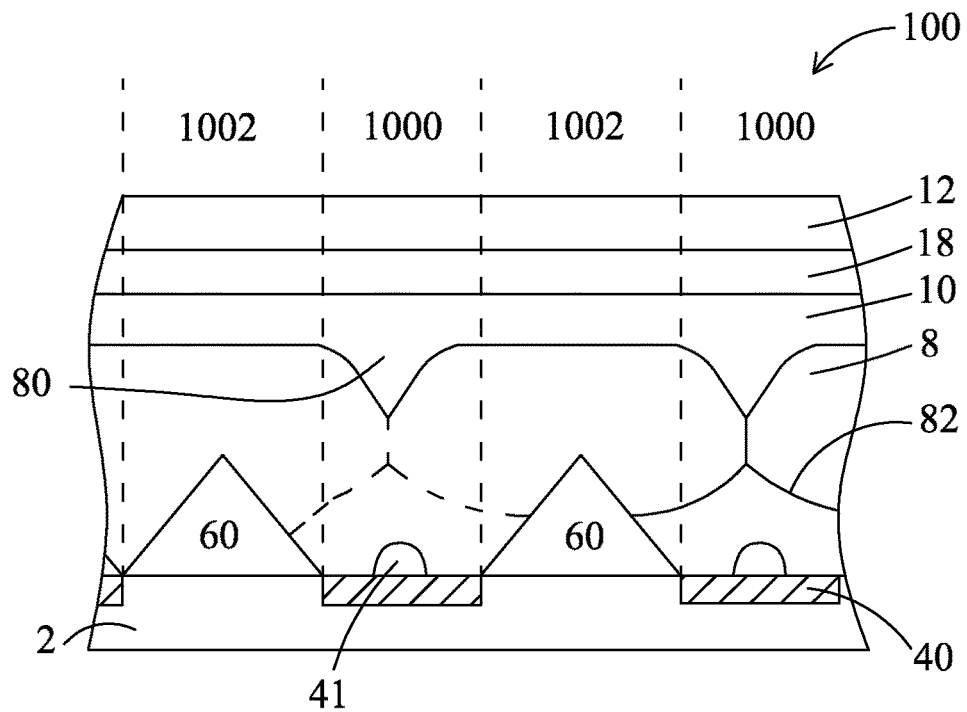

Referring to FIG. 2F, the second buffer layer 18 and the device layer 12 are sequentially formed on the intermediate layer 10. The device layer 12 can be a semiconductor layer configured to emit incoherent light. In another embodiment, the device layer 12 can be a semiconductor layer comprising two-dimensional electron gas so semiconductor device 100 can be a power device, such as a BJT, a FET, or a MOS. The epitaxial layers comprise first sections 1000 and second sections 1002 arranged along a direction vertical to the normal of the substrate 2. To be more specific, the epitaxial layers on the first regions 4 are designated as first sections 1000, and the epitaxial layers on the second region 6 are designated as second sections 1002. As mentioned above, the intermediate layer 10 comprising AlGaN is sandwiched by the first buffer layer 8 comprising GaN and the second buffer layer 18 comprising GaN. Therefore, the lattice constant of the intermediate layer 10 is different from the buffer layers 8 and 18 and the intermediate layer 10 suffers the stress from the buffer layers 8 and 18. The stress on the intermediate layer 10 in second sections 1002 and the stress on the intermediate layer 10 in the first sections 1000 are different. Because the voids 41 on the first regions 4 provide a space for stress relaxation, the second sections 1002 on the second region 6 suffer larger stress than the stress applied to the first sections 1000. Moreover, the stress applied to the intermediate layer 10 can be compress stress or tensile stress according to process and the composition of the epitaxial layers.

In the above embodiment, the substrate 2 is a crystalline structure having a fixed lattice constant and comprises silicon (Si). The substrate 2 can be configured for epitaxial growth. The pattern structures 40 are formed on the first regions 4 and comprise carbon (C), and the nuclei structure 60 is formed on the second region 6 and comprises AlN. The first buffer layer 8 comprises GaN and is lattice mismatched with the substrate 2. An intermediate layer 10 comprising AlGaN and a second buffer layer 18 comprising GaN are sequentially formed on the first buffer layer 8. The device layer 12 on the second buffer layer 18 comprises GaN. The intermediate layer 10 is formed along a direction from the substrate 2 to the device layer 12. The intermediate layer 10 comprises $Al_xGa_{1-x}N$ and the intermediate layer 10 can further be designated as different portions based on the difference of composition of the portion. For example, the intermediate layer 10 is designated as a first portion, a second portion, and a third portion along a direction from the substrate 2 to the intermediate layer 10. The designation of the portions is based on the composition ratios of the portions. For example, the first portion comprises $Al_{0.8}Ga_{0.2}N$, and the Al has a composition ratio of 0.8, which is different from the composition ratio of Al that is 0.4 ($Al_{0.4}Ga_{0.6}N$) in the second portion. The related example about the "composition ratio" of the contents within the portion is described in the following paragraph.

The first buffer layer 8 and the second buffer layer 18 are crystalline layers and can be formed by a method of metal-organic chemical vapor deposition at a temperature over 500° C. The first buffer layer 8 and the second buffer layer 18 comprise a first III-nitride material while the intermediate layer 10 comprises a second III-nitride material different from the first III-nitride material. The first III-nitride material can be GaN, and the second III-nitride material can be AlN. Moreover, the nuclei structure 60 comprises AlN and the intermediate layer 10 comprises AlGaN.

Figure 3:
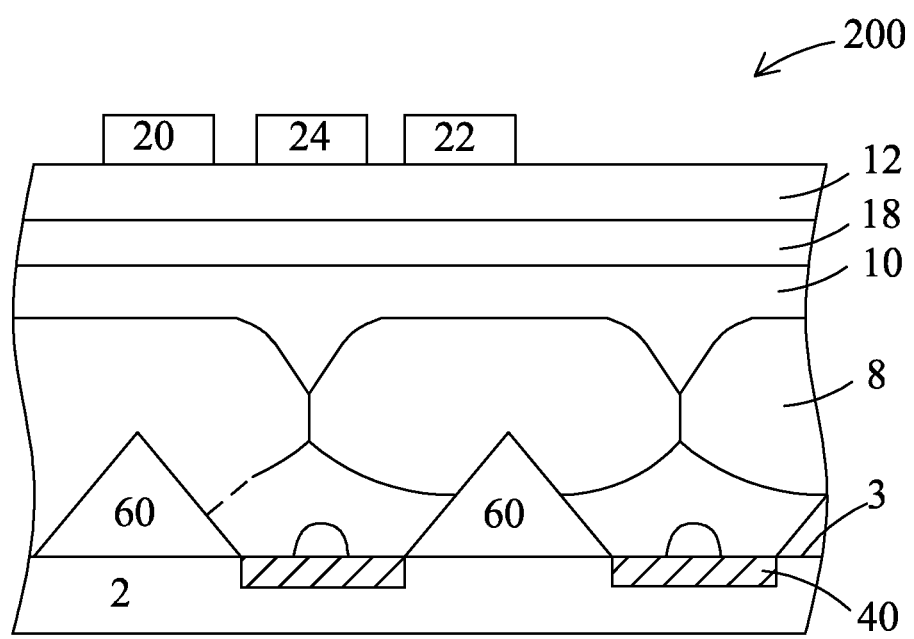
FIG. 3 shows a semiconductor device in accordance with an embodiment of the present disclosure.

FIG. 3 shows a cross-sectional view of a semiconductor device 200 in accordance with an embodiment of this application. The semiconductor device 200 comprises a substrate 2, multiple pattern structures 40, nuclei structure 60, a first buffer layer 8, an intermediate layer 10, a second buffer layer 18, a semiconductor device layer 12, and electrodes 20, 22 and 24. In this embodiment, the semiconductor device layer 12 is a field effect transistor (FET) and the electrodes 20, 22 and 24 are respectively configured as a drain electrode, a source electrode and a gate electrode. In another embodiment, the device layer 12 is a horizontal type light-emitting device, and two electrodes of the three electrodes 20, 22, and 24 are connected to the p-type semiconductor layer and the n-type semiconductor layer in the device layer 12. In another embodiment, the device layer 12 is a vertical type light-emitting device comprising one electrode on the device layer 12 and another electrode (not shown) connecting to the surface of the substrate 2 opposite to the surface 3. The two electrodes respectively electrically connect to the p-type and the n-type semiconductor layers of the device layer 12 respectively. Moreover, the substrate 2 can be optionally removed and the semiconductor device 200 can be attached to another substrate, such as a flexible substrate, or a heat dissipation substrate, for different applications.

Figure 4A:
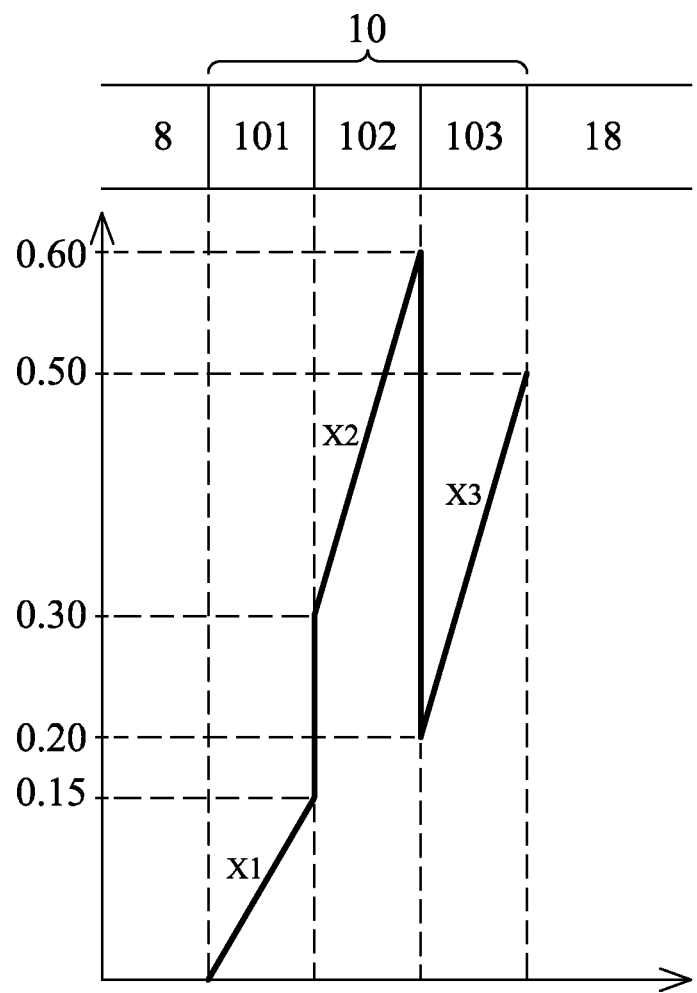
FIGS. 4A-4B show composition plot of the intermediate layer in accordance with embodiments of the present disclosure.

As discussed above, the composition of the intermediate layer 10 is variable. Referring to FIG. 4A, the intermediate layer 10 comprises three portions 101~103, and the composition of $Al_xGa_{1-x}N$ in the three portions are different. In this embodiment, the first portion 101 is contacted with the first buffer layer 8 and comprises $Al_{x1}Ga_{1-x1}N$ with a first composition ratio x1 of Al. The second portion 102 on the first portion 101 comprises $Al_{x2}Ga_{1-x2}N$ with a second composition ratio x2 of Al, and the third portion 103 between the second portion 102 and the second buffer layer 18 comprises $Al_{x3}Ga_{1-x3}N$ with a third composition ratio x3 of Al, wherein the first composition ratio, the second composition ratio, and the third composition ratio are different. In the present embodiment, the first composition ratio x1 is between 0~0.15 (ex. x1 can be 0.02, 0.03, 0.076 or 0.12), the second composition ratio x2 is between 0.3~0.65 (ex. x2 can be 0.32, 0.4, 0.58 or 0.61), and the third composition ratio x3 is between 0.2~0.5 (ex. x3 can be 0.21, 0.37, 0.408 or 0.46). In this embodiment, the second composition ratio x2 is greater than the third composition ratio x3 and the third composition ratio x3 is greater than the first composition ratio x1. Referring to FIG. 4A, the composition in one portion increases along a direction from the first buffer layer 8 to the second buffer layer 18. Moreover, the value can be increased or decreased along a direction from the substrate 2 to the second buffer layer 18. Besides, the composition ratio in one portion can be a fixed value or a variable value varied with the distance between the portion and the substrate 2.

Figure 4B:
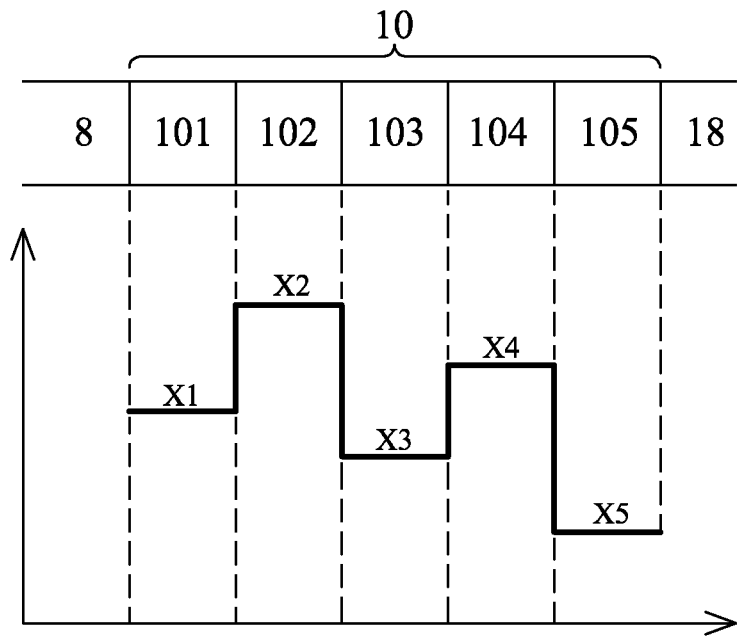

In another embodiment, the intermediate layer 10 comprises multiple portions, wherein one portion sandwiched by the other two portions has a larger ratio of Al than the other two portions. Referring to FIG. 4B, the intermediate layer 10 comprises five portions 101~105. The first portion 101 has a first composition ratio x1 of Al, the second portion 102 has a second composition ratio x2 of Al, the third portion 103 has a third composition ratio x3 of Al, the fourth portion 104 has a fourth composition ratio x4 of Al, and the fifth portion 105 has a fifth composition ratio x5 of Al. The second composition ratio x2 is larger than the first composition ratio x1 and the third composition ratio x3, and the fourth composition ratio x4 is larger than the third composition ratio x3 and the fifth composition ratio x5. Furthermore, the ratio of Al is a constant value in each portion. For example, the first portion 101 has a constant first composition ratio x1, the second portion 102 has a constant second composition ratio x2, the third portion 103 has a constant third composition ratio x3, the fourth portion 104 has a constant fourth composition ratio x4, and the fifth portion 105 has a constant fifth composition ratio x5. In this embodiment, the first composition ratio x1 is larger than the third composition ratio x3, and the third composition ratio x3 is larger than the fifth composition ratio x5. In another embodiment, the first composition ratio x1 is smaller than the third composition ratio x3, and/or the third composition ratio x3 is smaller than the fifth composition ratio x5. Or, the first composition ratio x1 is equal to the third composition ratio x3. To sum up, the composition ratios of Al (or the amount of Al) in accordance with the portions in the intermediate layer 10 can be decreased, increased or remaining the same along a direction from the substrate 2 to the second buffer layer 18. Since the compositions of the portions are different, the lattice constants between the portions are different. According to the experiment results, when the difference between the composition of the second portion and the composition of the first portion (that is, absolute value of (x1−x2)) is larger than 0.2, the difference of lattice constants of the second portion and the first portion is larger than 0.56%. Furthermore, the difference between the composition ratio of the second portion and the composition ratio of the first portion can be in a range of 0.05~0.6 (i.e., 0.05<|x2−x1|<0.6), and the difference of lattice constants is therefore between 0.13%~2.13%.

In one embodiment, the compositions are fixed within the portion as FIG. 4B shows. That is, the first composition ratio x1 of Al can be a fixed value between 0~0.15, the second composition ratio x2 of Al can be a fixed value between 0.3~0.65, and the third composition ratio x3 of Al can be a fixed value between 0.2~0.5. In another embodiment, only one portion has a fixed composition of Al (such as the composition depicted in FIG. 4B) while the other portions have varied compositions of Al (such as the composition depicted in FIG. 4A); or only one portion has a varied composition of Al while the other portions have fixed compositions of Al. In addition, the varied compositions in the portions can be in the same range or in different ranges. For example, the first composition ratio x1 of Al and the second composition ratio x2 of Al are both varied in a same range between 0~0.15; or the first composition ratio x1 of Al is varied in a range between 0~0.15 and the second composition ratio x2 of Al is varied in another range such as between 0.2~0.3 or in another range between 0.1~0.3.

Figure 5:
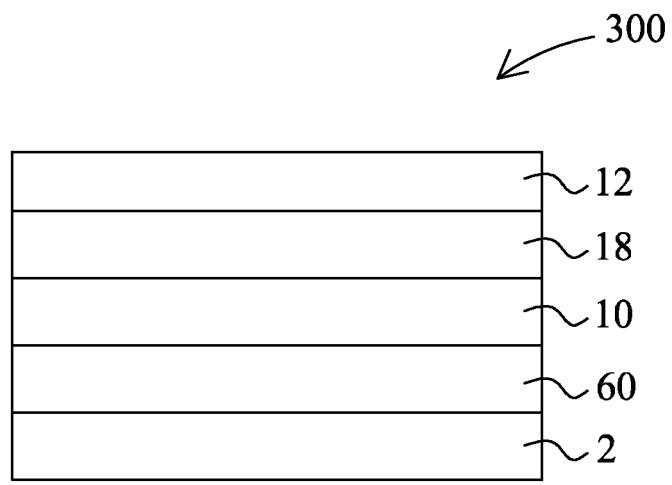
FIG. 5 shows a schematic view of a semiconductor device in accordance with an embodiment of the present disclosure.

FIG. 5 shows a schematic view of a semiconductor device 300 in accordance with an embodiment of this application. The semiconductor device 300 comprises a substrate 2, a nuclei structure 60, an intermediate layer 10, a buffer layer 18, and a semiconductor device layer 12. The intermediate layer 10 comprises AlGaN and has a varied composition of Al as depicted in FIGS. 4A and 4B. Therefore, the lattice constant of one portion in the intermediate layer 10 is different from that of the neighboring portions. The dislocation in one portion does not extend to another portion or connect to another dislocation in the portion, and the epitaxial quality of the intermediate layer 10 is therefore improved. Moreover, the compositions depicted in FIGS. 4A~4B can be applied to the embodiments in FIGS. 1~3, and the presented structures can be combined with each other for different requirement.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A semiconductor device, comprising:
   a substrate having a first region as single crystalline structure and a second region as polycrystalline structure or amorphous structure, and the second region of the substrate comprises an impurity absent in the first region, wherein the substrate comprises a top surface and a bottom surface opposite to the top surface;
   a nuclei structure on the first region of the substrate and located on the top surface, and the nuclei structure is absent on the second region of the substrate;
   a first crystalline buffer layer on the nuclei structure, lattice-mismatched with the substrate, and the first crystalline buffer layer physically contacts with a portion of the second region, wherein the nuclei structure comprises a top closer to the first crystalline buffer layer, and the second region comprises a surface closer to the first crystalline buffer layer, wherein the surface is closer to the bottom surface of the substrate than the top is;
   a second crystalline buffer layer on the first crystalline buffer layer;
   an intermediate layer located between the first crystalline buffer layer and the second crystalline buffer layer; and
   a semiconductor device layer on the second crystalline buffer layer.

2. A semiconductor device according to claim 1, wherein the first crystalline buffer layer and the second crystalline buffer layer comprise a first nitride material having a first element, and the intermediate layer comprises a second nitride material having a second element which is different from the first element.

3. A semiconductor device according to claim 1, wherein the semiconductor device layer comprises a two-dimensional electron gas or a light-emitting layer.

4. A semiconductor device according to claim 1, wherein the intermediate layer comprises a first portion having a first composition ratio of a first element and located on the first crystalline buffer layer, a second portion having a second composition ratio of the first element and located on the first portion, and a third portion having a third composition ratio of the first element and located between the second portion and the second crystalline buffer layer, wherein the first composition ratio, the second composition ratio, and the third composition ratio are different.

5. A semiconductor device according to claim 1, wherein the first region is continuous and the second region is discontinuous.

6. A semiconductor device according to claim 1, further comprising multiple voids formed on the second region and separated from each other.

7. A semiconductor device according to claim 1, further comprising multiple thread dislocation lines above the first region and bending toward the second region.

8. A semiconductor device according to claim 1, wherein the first crystalline buffer layer comprises a surface roughness larger than that of the intermediate layer.

9. A semiconductor device according to claim 1, wherein the nuclei structure comprises an inclined sidewall.

10. A semiconductor device according to claim 4, wherein the second composition ratio is greater than the first composition ratio and the third composition ratio.

11. A semiconductor device according to claim 1, wherein the nuclei structure has a bottom which is wider than the top, and the bottom connects with the first region of the substrate.

12. A semiconductor device according to claim 1, wherein the substrate comprises silicon and the semiconductor device layer comprises gallium nitride (GaN).

13. A semiconductor device according to claim 12, wherein the first crystalline buffer layer and the second crystalline buffer layer comprise GaN, and the intermediate layer comprises AlGaN.

14. A semiconductor device according to claim 12, wherein the nuclei structure comprises aluminum nitride (AlN).

15. A semiconductor device according to claim 1, wherein a void is located between the second region of the substrate and the first crystalline buffer layer.

16. A semiconductor device according to claim 15, wherein the void is absent between the first region of the substrate and the first crystalline buffer layer.

17. A semiconductor device according to claim 1, wherein a pattern interface is formed between the first crystalline buffer layer and the intermediate layer.

18. A semiconductor device according to claim 17, wherein the pattern interface comprises several recesses, and each of the recesses comprises a vertex portion.

19. A semiconductor device according to claim 18, wherein the vertex portion is formed on and aligned with the second region of the substrate.

20. A semiconductor device according to claim 1, wherein the second region extends from the surface to a depth in the substrate.

\* \* \* \* \*